(12) United States Patent
Goto et al.

(10) Patent No.: US 7,157,666 B2
(45) Date of Patent: Jan. 2, 2007

(54) SYSTEMS FOR PRODUCING SEMICONDUCTORS AND MEMBERS THEREFOR

(75) Inventors: Yoshinobu Goto, Nagoya (JP); Hideyoshi Tsuruta, Tokai (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 10/753,583

(22) Filed: Jan. 8, 2004

(65) Prior Publication Data

US 2004/0144767 A1    Jul. 29, 2004

Related U.S. Application Data

(60) Provisional application No. 60/441,521, filed on Jan. 21, 2003.

(51) Int. Cl.
*C23C 16/00* (2006.01)
*F27B 5/08* (2006.01)
*F27B 5/16* (2006.01)

(52) U.S. Cl. .................. 219/390; 392/418; 118/725
(58) Field of Classification Search ............... 219/390, 219/405, 411; 392/416, 418; 118/724, 725, 118/50.1
See application file for complete search history.

(56) References Cited

U.S. PATENT DOCUMENTS

| 5,872,889 | A * | 2/1999 | Kaltenbrunner et al. | 392/418 |
| 6,407,368 | B1* | 6/2002 | Hsu et al. | 219/390 |
| 6,442,950 | B1* | 9/2002 | Tung | 62/62 |
| 6,537,422 | B1* | 3/2003 | Sakuma et al. | 156/345.5 |
| 6,709,523 | B1* | 3/2004 | Toshima et al. | 118/725 |
| 6,741,804 | B1* | 5/2004 | Mack et al. | 392/416 |

FOREIGN PATENT DOCUMENTS

JP    05-326112 A1    12/1993

* cited by examiner

*Primary Examiner*—Joseph M. Pelham
(74) *Attorney, Agent, or Firm*—Burr & Brown

(57) ABSTRACT

A member provided around a susceptor for mounting a semiconductor in a chamber of a semiconductor production system. The member has a face opposing the susceptor and a center line average surface roughness of the face opposing the susceptor is 0.5 μm or less. Alternatively, the face opposing the susceptor has a thermal emissivity ϵ of 0.5 or lower. The member can also be a liner [4] having a supported face [4] whose area is not more than 20 percent of that of the face [4] opposing the susceptor.

16 Claims, 6 Drawing Sheets

SYSTEMS FOR PRODUCING SEMICONDUCTORS AND MEMBERS THEREFOR

This application claims the benefit of U.S. provisional application 60/441,521 filed on Jan. 21, 2003, the entirety of which is incorporated by reference.

BACKGROUND OF THE INVENTION

1. Field of the Invention

The present invention relates to a member for use in a semiconductor producing system that is provided around a susceptor for mounting a semiconductor, in a semiconductor producing chamber.

2. Related Art Statement

In a semiconductor producing system, it is known to mount a semiconductor wafer on a ceramic heater to heat the wafer when a semiconductor thin film is produced on the wafer from gaseous raw materials such as silane gas by means of thermal CVD or the like (i.e., a direct heating system). So-called multi-zone heaters have been known as ceramic heaters used in such direct heating systems. Such a multi-zone heater includes a ceramic substrate having inner and outer resistance heat generators made of high melting point metals embedded within the substrate. Separate power supply terminals are connected to the respective heat generators so that electric power may be applied independently on the respective heat generators. The inner and outer heat generators may be thus independently controlled.

In JP-A 5-326112, a resistance heat generator of a ceramic heater is constituted by a plurality of circuit patterns, each made of a high melting point metal. The circuit patterns are arranged so that they may supplement one another's defect portions. For example, one of the patterns has a defect portion such as a folded portion or a returning portion. In this case, another circuit pattern is overlapped on or over the defect portion of the one pattern.

For example, in a heater to be used for heating semiconductor wafers, the temperature of the heating face of the heater needs to be uniformly controlled over the entire surface. It is required that the heater satisfy a severe specification, for example, that the temperature measured on the heating face is within ±5° C. of the average of the whole heating face under a use condition.

SUMMARY OF THE INVENTION

A ceramic heater with an inner resistance heat generator is produced and an electrical power is supplied to the heat generator so that the average temperature of the heating face reaches a desired target value. It is now provided that the temperature over the heating face is within a desired range after the average temperature reaches the target value. Even in this case, however, the temperature distribution of the heating face may substantially change after the heater is actually fixed in a chamber. Such a change in temperature distribution depends on various conditions as follows. A fitting is used to fix a ceramic heater on the wall of a chamber. The area and shape of the surface region of the heater that contacts the fitting may affect the temperature distribution. In addition to this, the temperature distribution may be affected by the thermal capacity of the fitting, the shape and thermal capacity of a chamber, thermal reflection and absorption on the inner wall surface of a chamber, and the pressures and gas flow inside and outside of the chamber.

Even when the heating face of a ceramic heater has a desired uniform temperature before the heater is fixed in a chamber, the temperature distribution may not maintain the desired uniformity after the heater is fixed in the chamber, according to the above reasons. It is thus desired to adjust the power supplied to the heat resistor so that the temperature distribution on the heating face can be reduced after the heater is fixed in a chamber.

Such an adjustment may actually be difficult due to the following reasons. That is, when the power supplied to the heat resistor is increased or decreased, the entire heat energy that is generated by the heat resistor changes. In this case, the temperature distribution on the heating face is not necessarily reduced and even may be increased after the ceramic heater is fixed in the chamber. Further, the two-zone heater described above may be effective for changing the average temperatures of the outer and inner portions of the heating face, respectively and independently. In such a two-zone heater, however, hot spots or cold spots may be observed in only a part of the heating face after the two-zone ceramic heater is fixed in a chamber. The two-zone control system may not be effective for reducing such cold and hot spots that are observed in only a small part of the heating face.

The inventors also considered the following system. That is, a ceramic heater is divided into many zones and separate resistance heat generators are provided each corresponding with each zone. The electric power values provided to the heating elements are independently controlled. When a cold spot is observed in one of the zones of the heating face, it is effective to increase the electric power that is supplied to the heat generator corresponding with the zone where the cold spot is observed. Such an increased electric power to the zone improves the heat generation so that the cold spot may be reduced or cancelled.

The inventors have investigated this idea and finally found that the control may be also ineffective for reducing the temperature distribution. The reasons would be as follows. The temperature of each zone of the heating face is influenced by the heat generation right under the zone, as well as the heat generation by another heat generators provided right under another zones, respectively. The temperature distribution on the heating face may be determined by many factors including the following: heat generated from each heat generator; the shape, dimension and thermal capacity of a ceramic substrate; and the temperature, pressure and gas flow around the substrate. Such factors may affect each other. It is possible to reduce or cancel a cold spot by increasing the electric power that is supplied to a heat generator corresponding with the zone where the cold spot is observed.

In this case, however, the heat generated from the heating element right under the cold spot is transmitted to adjacent zones, so that the total balance of heat generation and transfer in the substrate and the temperature distribution on the heating face may change. Such a change in the balance of heat generation and transfer may generate a new hot spot on the heating face, or increase the average temperature of the surface. When the average temperature of the heating face is increased, it is necessary to reduce the electric power values that are supplied to other heat generators provided for other zones. Such a reduction of the electric power that is supplied to other heat generators may induce other cold spots on the heating face. The difference between the maximum and minimum temperatures on the heating face may be thus increased in many cases by canceling one cold spot as described above.

An object of the present invention is to provide a method of heating a semiconductor on a susceptor in a chamber, in which the temperature distribution on the susceptor can be reduced even when the target temperature of the susceptor is high.

According to a first aspect of the present invention, a member is provided around a susceptor for mounting a semiconductor in a chamber for a semiconductor production system. The member has an opposing face opposing the susceptor and has a center line average surface roughness of 0.5 μm or lower.

The inventors have studied the cause of deviation in the temperature distribution on the surface of a susceptor, such as cold and hot spots, and reached the following discovery. For example, it is provided that a metal heat generating wire is embedded in a ceramic susceptor to produce a ceramic heater. When electric power is supplied to the wire in the heater to generate heat, the electric power supplied and the temperature uniformity on the heating face of the heater correlate with each other. That is, as the electric power is decreased, the temperature uniformity on the heating face of the heater and semiconductor wafer thereon increases, provided that the target temperature on the heating face is not changed. The reasons would be as follows. In any heater, the heat generator therein has a local resistance distribution and a thermal resistance deviation between the heat generator and the ceramic material. As the electric power supplied to the heat generator increases, the influence of the local resistance distribution of the heat generator, as well as the thermal resistance deviation between the heat generator and the ceramic material on the uniformity of temperature on the heating face are more considerable. The temperature uniformity on the heating face may be adversely affected to result in cold and hot spots. It is thus desired to reduce the supplied electric power that is required to attain the target temperature on the heating face.

According to the inventor's study, a substantial portion of the electric power that is supplied to the ceramic heater is not utilized for convection heating of a semiconductor wafer, which is a major purpose, resulting in a substantial heat loss from the heater to the outside thereof. The electric power that must be supplied to the heat generator required to attain the target temperature increases. It is thus difficult to attain a uniform temperature distribution on the heating face of the heater.

The heat loss from the heater, which is not utilized for the convection heating of the wafer, includes the followings:

(1) Thermal transmission from the heater substrate to atmosphere in a chamber;

(2) Thermal conduction from the heater substrate to a cooling portion of an end of a shaft (a member for supporting the heater); and (3) Heat transfer by radiation from the heater substrate to a member (for example a gas supply plate or liner) in a chamber.

Since the distance between each member in a chamber and the heater is relatively small and the member has a low surface temperature, the effect (3) of the heat transfer by radiation toward the members in the chamber proved to be the largest. Based on this discovery, the inventors noted the thermal radiation to a member in a chamber and reached the idea of reducing the center line average surface roughness Ra of the face of the member opposing the susceptor to 0.5 μm or lower. It is thus possible to reduce the amount of heat energy that is radiated without being utilized to heat the semiconductor through the susceptor, and to reduce the energy supplied to the susceptor that is required for the target heating temperature. It is thus possible to improve the temperature uniformity on the heating face of the susceptor while the desired target temperature can be attained.

According to a second aspect of the present invention, a member is provided around a susceptor for mounting a semiconductor in a chamber for a semiconductor production system. The member has an opposing face opposing the susceptor which has a thermal emissivity $\epsilon$ of 0.5 or lower.

According to this aspect of the present invention, the thermal emissivity $\epsilon$ of the face of the member facing the susceptor is made 0.5 or lower. It is thus possible to reduce the heat energy that is radiated without being utilized to heat the semiconductor through the susceptor, and to reduce the energy that is supplied to the susceptor to reach the target heating temperature. It is thus possible to improve the temperature uniformity of the susceptor while attaining the desired target temperature.

According to a third aspect of the present invention, a member is provided around a susceptor for mounting a semiconductor in a chamber for a semiconductor production system. The member is a liner having an opposing face opposing the susceptor and a supported face whereby the liner is supported, and the supported face has an area that is no more than 20 percent of that of the opposing face.

The inventors have further studied the causes of an increase in thermal radiation from the susceptor to the liner. They noted that the temperature of the supported face of the liner is relatively low, even when the target temperature of the susceptor is high. The reasons are as follows. The supported face of the liner is fixed onto the inner wall surface of the chamber, which is constantly cooled with a cooling medium flowing in the chamber wall. The entire liner is thus maintained at a relatively low temperature. The inside of the chamber is normally cooled with flowing water, so that the inner wall surface of the chamber is maintained at a temperature of 70° C. or lower.

The present inventors have reached the idea of reducing the area of the supported face of the liner to no more than 20 percent of the area of the opposing face of the liner. It is thus possible to considerably reduce the thermal conduction by convection from the liner to the inner wall surface of the chamber, so that the temperature gradient in the liner can be increased. It is thus possible to reduce the power loss due to thermal radiation from the susceptor to the liner and to reduce the power required to attain the desired target temperature. It is thus possible to improve the temperature uniformity of the susceptor while attaining the desired target temperature.

According to a fourth aspect of the present invention, a member is provided around a susceptor for mounting a semiconductor in a chamber for a semiconductor production system. The member is a liner having an opposing face opposing the susceptor, a back face facing the chamber and a thin portion between the opposing and back faces. The thin portion has an average thickness of 10 mm or smaller.

According to this aspect of the present invention, the thermal conduction by convection from the liner to the inner wall surface of the chamber can be considerably reduced so that the temperature gradient in the liner can be increased. It is thus possible to reduce the power loss due to thermal radiation from the susceptor to the liner and to reduce the power required to attain the desired target temperature. It is thus possible to improve the temperature uniformity of the susceptor while attaining the desired target temperature.

The present invention further provides a semiconductor producing system comprising a chamber, a susceptor for mounting a semiconductor, and a member according to any one of the above aspects that is provided around the susceptor.

These and other objects, features and advantages of the invention will be appreciated upon reading the following description of the invention taken in conjunction with the attached drawings, with the understanding that some modifications, variations and changes of the same could be made by the skilled person in the art.

BRIEF DESCRIPTION OF THE DRAWINGS

FIG. 2 (b) is a plan view of the gas supply plate 3.

FIG. 4(b) is a bottom view showing a supported face of a liner according to another embodiment.

DETAILED DESCRIPTION OF THE INVENTION

The present invention will be described further in detail, referring to the attached drawings. A system for producing semiconductors and members used for the system will be generally described, and embodiments of the present invention will then be described.

Figure 1:
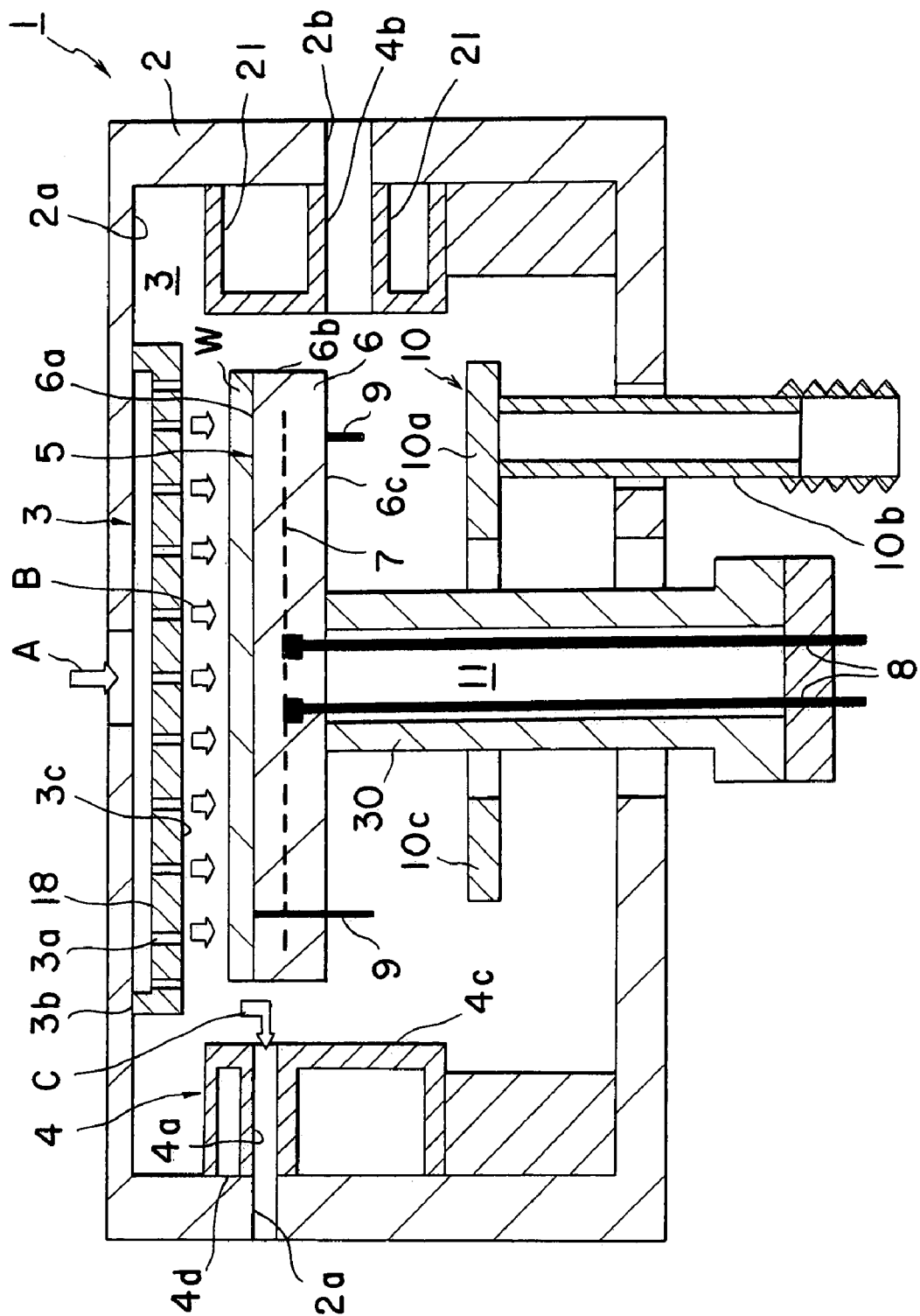
FIG. 1 is a cross sectional view schematically showing a system 1 for producing semiconductors according to one embodiment of the present invention.

FIG. 1 is a cross sectional view schematically showing a semiconductor producing system 1 according to the present invention. In the system 1 of the present example, a susceptor 5 is fixed in a chamber 2. The susceptor 5 has a substrate 6 and a heat generating element 7 embedded in the substrate 6. A semiconductor wafer W is mounted on a heating face 6a of the substrate 6. Elevating pins 9 are inserted in the substrate 6. A cylindrical supporting member (shaft) 30 is joined with a back face 6c of the substrate 6. Electrical power supplying members 8 are inserted and fixed in an inner space 11 of the supporting member 30.

Figure 2:
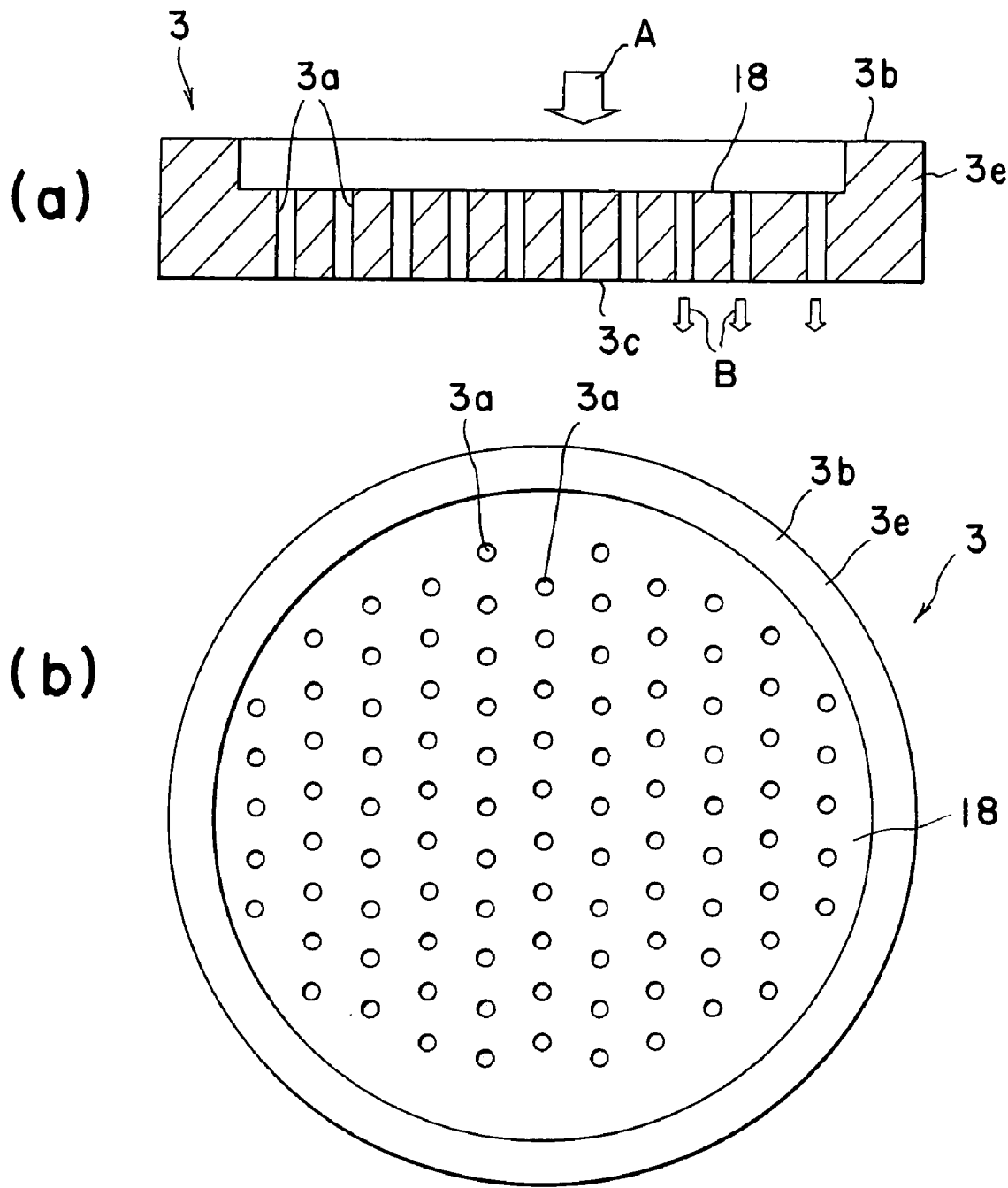
FIG. 2 (a) is a cross sectional view schematically showing a gas supply plate 3.

A gas supply plate 3 is fixed at a position opposing the semiconductor wafer W. FIG. 2(a) is a cross sectional view schematically showing the gas supply plate 3 according to the present example, and FIG. 2 (b) is a front view showing the gas supply plate 3 from the back side 3b.

Many gas holes 3a are provided in the gas supply plate 3. A circular recess 18 is formed on the back face 3b of the gas supply plate 3. A gas is supplied from the side of the back face 3c of the gas supply plate 3 in the direction of arrow "A" and the gas is then distributed into the gas holes 3a and discharged from the gas holes 3a as shown by arrows "B."

The gas supply plate 3 has a space 18 formed in the side of the back face 3b, so that a ring-shaped thin portion 3e is formed around the space 18. The upper face 3b of the thin portion 3e contacts the chamber.

Figure 3:
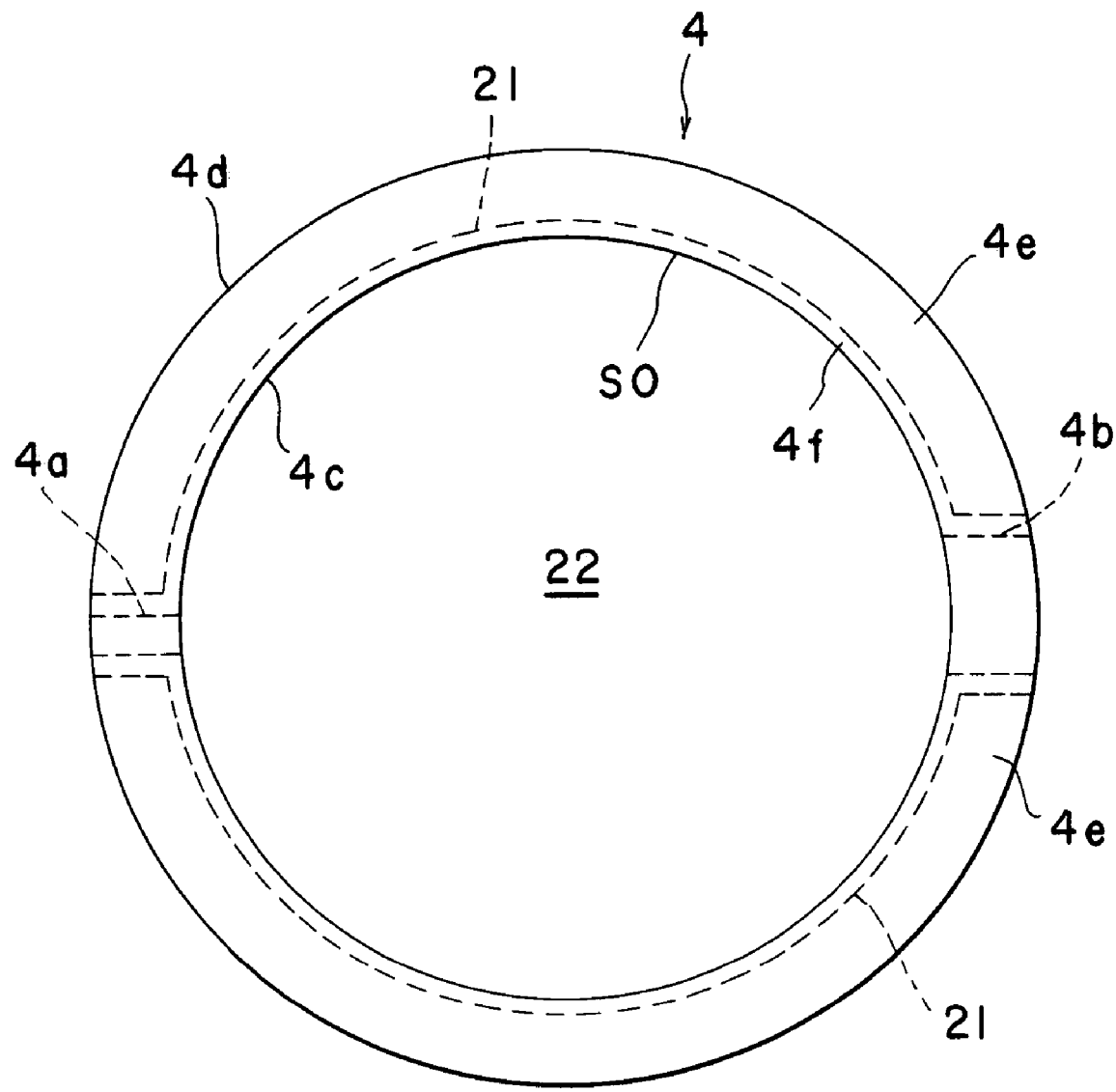
FIG. 3 is a plan view showing a liner 4.
Figure 4:
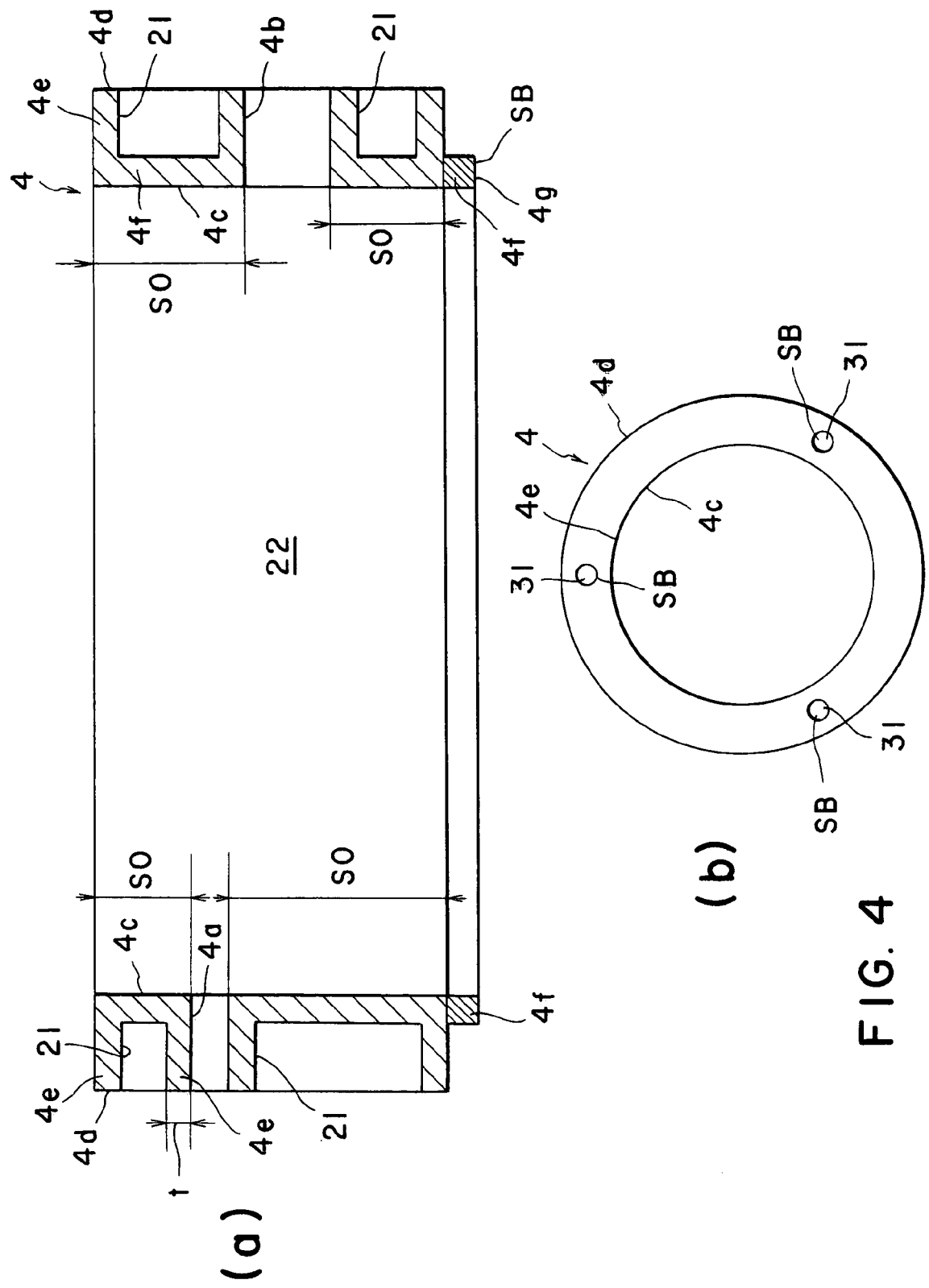
FIG. 4 (a) is a cross sectional view showing a liner 4.

FIG. 3 is a plan view showing a liner 4 according to the present example, and FIG. 4 (a) is a cross sectional view showing the liner 4. The liner 4 is substantially ring shaped in a plan view. A substantially circle-shaped recess 22 is formed inside of the liner 4. The susceptor and wafer are contained and surrounded in the recess 22. A gas supply hole 4a and a wafer supply hole 4b are provided between the outer surface 4d and opposing face 4c of the liner 4.

A ring-shaped space 21 facing the side of outer surface 4d is formed in the liner 4. As a result, a main portion is formed in the side of the opposing face 4c and a thin portion 4e is formed in the side of the back face 4d. The outer surface 4d is also an end face of the thin portion 4e that opposes the inner wall surface of the chamber. Ring-shaped supporting protrusions 4f are formed on bottom face of the liner 4, so that the liner is supported on the inner wall surface at the bottom faces 4f of the protrusions 4f.

Figure 5:
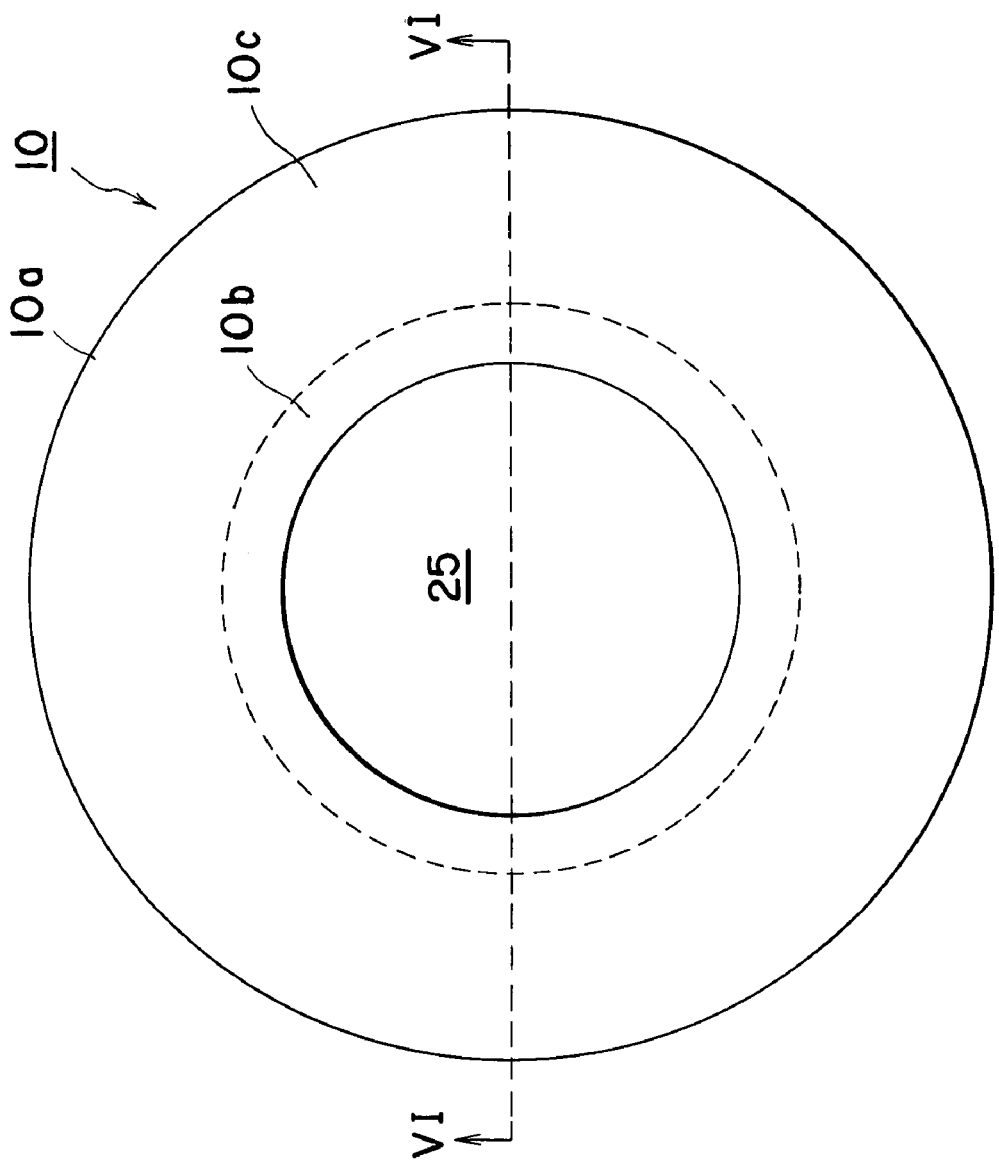
FIG. 5 is a plan view showing a lifter 10 for an elevating pin.
Figure 6:
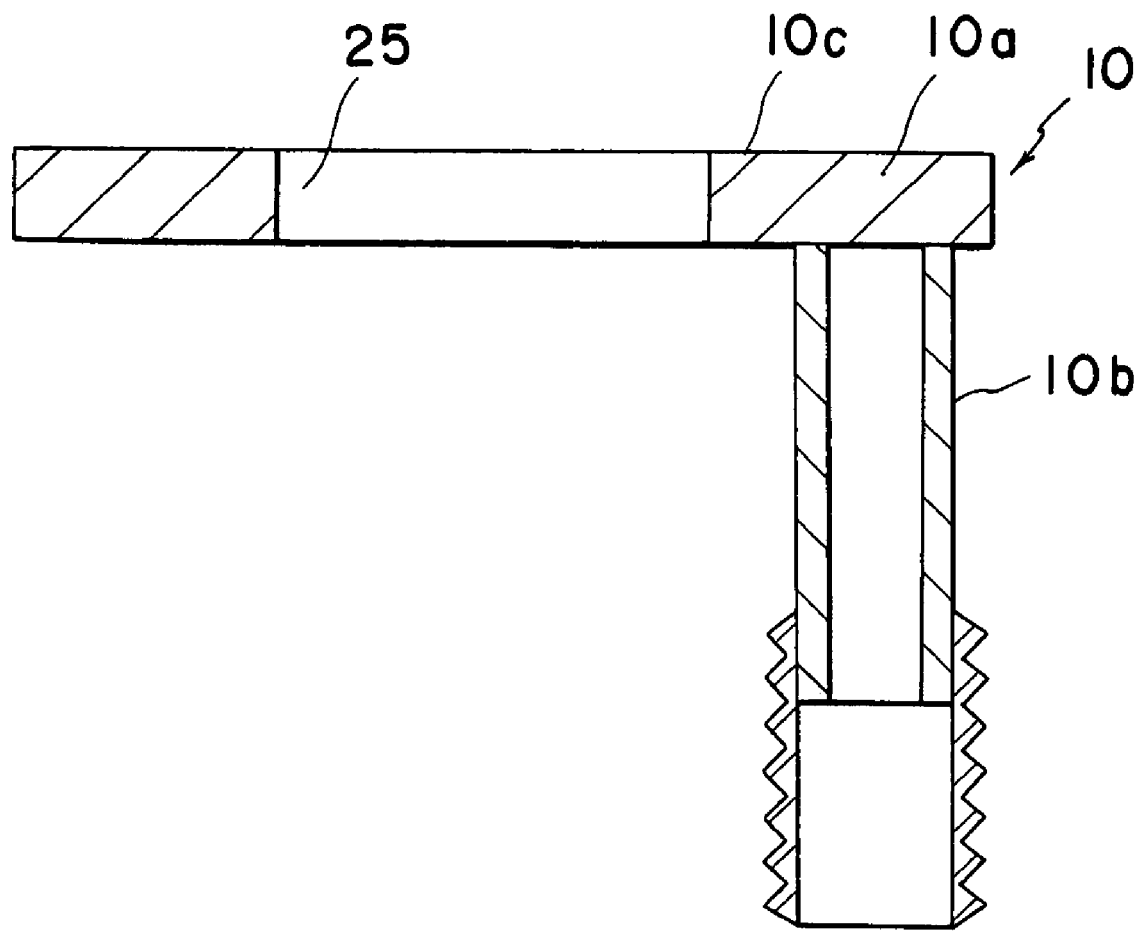
FIG. 6 is a cross sectional view schematically showing a lifter 10 for an elevating pin.

FIG. 5 is a plan view showing a lifter 10 for an elevating pin, and FIG. 6 is a cross sectional view showing the lifter 10 for an elevating pin. The lifter 10 has a lift part 10a, and a cylindrical supporting part 10b attached on the back face of the lift part 10a. The upper face 10c of the lift part 10a opposes the susceptor and 25 represents a space.

According to the first aspect of the present invention, the opposing faces 3c, 4c and 10c of the members 3, 4 and 10 respectively oppose the susceptor 5, and each opposing face has a center line average surface roughness of 0.5 μm or lower. According to the present invention, the center line average surface roughness is more preferably 0.4 μm or lower.

The process by which the center line average surface roughness of the opposing face is reduced is not particularly limited, and includes grinding. The center line average surface roughness of the opposing face may be measured by a surface roughness tester.

According to the second aspect of the present invention, the opposing faces 3c, 4c and 10c of the members 3, 4 and 10 respectively oppose the susceptor 5, and each opposing face has a thermal emissivity $\epsilon$ of 0.5 or lower. According to the present invention, the thermal emissivity $\epsilon$ is preferably 0.3 or lower.

For example, the thermal emissivity may be easily measured with a contact type emissivity measuring system (ADVANCED ENERGY Co. Ltd. "MODEL 2100M") by contacting its sensor to an object for measurement without disturbances. The system has an optical cable and an integrating sphere equipped on the end of the cable. The system measures the thermal emissivity at room temperature. Although the $\epsilon$ value used in the present invention is a value at room temperature, the thermal emissivity is not considerably changed even at temperatures between 400 and 800° C. In such a case, the thermal emissivity measured at a temperature for use may be used as a substitute.

The means by which the thermal emissivity $\epsilon$ of the opposing face is reduced is not particularly limited, and includes the following:

(1) The center line surface roughness of the opposing face is reduced (smoothened) to reduce the thermal emissivity of the opposing face; and (2) The lightness of the opposing face is increased. In this case, the lightness of the opposing face is preferably N6.0 or higher.

Lightness will be described below. The surface color of a substance may be represented by three properties of color perception: hue, lightness and chroma. Lightness is a property representing a visual perception for judging the reflectance of the surface of a substance. The representations of the three properties are defined in "JIS Z 8721." The representation of lightness will be briefly described. The lightness "V" is defined based on achromatic colors. The lightness of ideal black and that of ideal white are defined as "0" and "10," respectively. Achromatic colors between the ideal black and ideal white are divided into 10 categories and represented as symbols from "N0" to "N10." The categories are divided so that each category has the same span in terms of visual perception of lightness. When the lightness of a ceramic substrate is actually measured, the surface color of the substrate is compared with standard color samples corresponding to "N0" to "N10" to determine the lightness of the substrate. The lightness is determined to the first decimal point, whose value is selected from "0" and "5."

Further, according to the third aspect of the present invention, the supported face 4g of the liner 4 has an area "SB" (refer to FIGS. 3 and 4) that is 20 percent or less than the area "SO" of the opposing face 4c. When the area "SB" of the supported face 4g is made considerably smaller than the area "SO" of the opposing face as described above, it is possible to both reduce the thermal transfer from the liner to the chamber and reduce the thermal transfer by radiation from the susceptor toward the opposing face of the liner. From this viewpoint, the area "SB" (refer to FIGS. 3 and 4) of the supported face 4g of the liner 4 is more preferably 10 percent or less than the area "SO" of the opposing face 4c.

Further, as shown in FIG. 4 (b), a plurality of, for example, three small protrusions, each substantially having a circular shape, may be provided on the bottom face of the liner 4 so that the end faces 31 of the protrusions function as the supported faces. In this case, the area "SB" is a total area of the end faces 31 of each protrusions.

According to the fourth aspect of the present invention, a thin portion having an average thickness of 10 mm or smaller is provided between the back face 4d (refer to FIGS. 3 and 4) of the liner facing the chamber and the opposing face 4c. That is, when a liner is substantially plate shaped, the thermal conduction between the back and opposing faces is large and the temperature gradient therebetween is small. According to the fourth aspect of the present invention, however, a thin portion having an average thickness of 10 mm or lower is provided so that the temperature gradient between the back face 4d and opposing face 4c is increased. This successfully reduces the thermal transfer by radiation from the susceptor to the liner. The liner 4 according to the present invention has a thin portion 4e having a thickness "t" of 10 mm or smaller. The average thickness of the thin portion is more preferably 5 mm or smaller.

Further, in a preferred embodiment, a space 18 is formed in the liner 4. The space may be formed inside of the liner 4. Most preferably, the space 18 faces the inner wall surface 2b of the chamber to further reduce the thermal conduction from the opposing face to the chamber.

The effects of the present invention are most considerable in a temperature range of 400° C. or higher. In a preferred embodiment, the target temperature of the semiconductor is set at 400° C. or higher.

Further, the advantageous effects of the present invention are most considerable when the distance between the opposing faces 3c, 4c and 10c of the member in the chamber and the susceptor are small. From this viewpoint, the distance between each of the opposing faces 3c, 4c and 10c of the members and the susceptor is preferably 300 mm or smaller, and more preferably, 50 mm or smaller.

The semiconductor producing system is a system for use in any process for producing semiconductors, including cleaning, etching, testing or the like. The members according to the present invention are members to be provided around a susceptor in a chamber of a semiconductor producing system.

The material of the member of the present invention is not particularly limited, and may preferably be a corrosion resistant ceramic or a corrosion resistant metal. More preferably, the material is an alloy of aluminum, alloy of nickel, an aluminum series ceramic such as alumina, aluminum nitride or the like, and a silicon series ceramic such as silicon nitride, silicon carbide, quartz, silica glass or the like.

The thermal emissivity of the opposing face of the member can be reduced by forming the member with an alloy of aluminum. Further, when the member is formed of a ceramic material, a fillet (having an R of 5 mm or larger) is preferably provided in the corner portion of the member to prevent cracks.

EXAMPLES

Comparative Example 1

A heat generating wire 7 made of a molybdenum coil spring was embedded in an aluminum nitride sintered body to obtain a heater 5. The heater 5 was fixed to a chamber 2 using a ceramic supporting member 30. Further, the gas supply plate, liner and lifter for elevating pin were contained and fixed in the chamber 2. The gas supply plate and liner each substantially had a rectangular parallelopiped shape, in which the space and thin portion shown in FIGS. 2 to 4 were not provided. The gas supply plate, liner and lifter for the elevating pin were made of silicon carbide, silicon nitride and silicon nitride, respectively. The opposing faces 3c, 4c and 10c were not subjected to a smoothing process. The center line average surface roughness Ra and thermal emissivity ϵ of each opposing face were shown in Table 1.

Electrical power of about 2000 W was supplied to the heat generating element 7 in the heater 5 to heat a semiconductor wafer W. The target temperature for the wafer W was set at 700° C. 17 points on the surface of the wafer were measured for temperature by means of a radiation thermometer to obtain the maximum and minimum temperatures. The difference between the maximum and minimum temperatures was calculated and is shown in Table 1.

TABLE 1

| | | Comparative example 1 | Inventive example 1 |
|---|---|---|---|
| Surface roughness of the opposing face of a member opposing a susceptor Ra (μm) | Gas supply plate | 0.8 | 0.2 |
| | Liner | 1.0 | 0.4 |
| | Lifter for elevating pin | 1.0 | 0.4 |
| Thermal emissivity ϵ of the face of a member opposing a susceptor | Gas supply plate | 0.6 | 0.2 |
| | Liner | 0.8 | 0.2 |
| | Lifter for elevating Pin | 0.8 | 0.3 |
| Supplied energy to susceptor (W) | | 2000 | 1000 |
| Difference between maximum and minimum temperatures of semiconductor (° C.) | | 15 | 8 |

According to Comparative Example 1, the difference between the maximum and minimum temperatures on the wafer is reduced to about 15° C. at a target temperature of 700° C.

Inventive Example 1

The temperature difference on the wafer was measured according to the same procedure as that in Comparative Example 1. In Inventive Example 1, the gas supply plate and liner substantially each had a rectangular parallelopiped shape, in which the space and thin portion shown in FIGS. 2 to 4 were not provided. The gas supply plate, liner and lifter for elevating pin were made of an alloy of aluminum, alumina and alumina, respectively. The opposing faces 3c, 4c and 10c were subjected to a smoothing process. The center line average surface roughness Ra and thermal emissivity ε of each opposing face are shown in Table 1.

As shown, the temperature difference on the wafer W is reduced to about 8° C. when the power supplied to the heater (susceptor) 5 is about 1000 W, which was about a half of that required in the Comparative Example 1.

It was thus found that a substantial portion of the power supplied to the susceptor 5 in Comparative Example 1 radiated to the gas supply plate, liner and lifter for the elevating pin, resulting in thermal loss. It was thus necessary to supply a large amount of power to the susceptor to compensate for the thermal loss in Comparative Example 1, so that cold and hot spots may be easily observed on the heating face. On the contrary, the power required to attain the target temperature was reduced to 1000 W in Inventive Example 1. It is thus possible to reduce cold and hot spots on the heating face and to reduce the temperature differences on the wafer.

Comparative Example 2

The experiment was carried out according to the same procedure as that in the Comparative Example 1. The gas supply plate, liner and lifter for elevating pin each substantially had a rectangular parallelopiped shape, in which the space and thin portion shown in FIGS. 2 to 4 were not provided. The gas supply plate, liner and lifter for elevating pin were made of an alloy of aluminum, alumina and alumina, respectively. The opposing faces 3c, 4c and 10c were not subjected to a smoothing process. The area "SO" of the opposing face and the area "SB" of the supported face of the liner were each about 63,000 mm². The thickness of the liner was 35 mm. In this Comparative Example, a small space was formed between the back face 4d and inner wall surface of the chamber.

Electrical power of about 2000 W was supplied to the heat generating element 7 in the heater 5 to heat a semiconductor wafer W. The target temperature for the wafer W was set at 700° C. 17 points on the surface of the wafer were measured for temperature by means of a radiation thermometer to obtain the maximum and minimum temperatures. The difference between the maximum and minimum temperatures is calculated and shown in Table 2.

TABLE 2

|  | Comparative Example 2 | Inventive Example 2 |
|---|---|---|
| Supplied energy for susceptor (W) | 2000 | 1500 |
| Area of region of liner contacted with chamber (mm²) | 63000 | 3000 |
| Difference of maximum and minimum temperatures of wafer (° C.) | 15 | 11 |

In Comparative Example 2, it was proved that the temperature difference on the wafer W was about 15° C. at a target temperature of 700° C., as shown above in Table 2.

Inventive Example 2

The temperature difference on the wafer was measured according to the same procedure as that in the Comparative Example 2. In Inventive Example 2, the gas supply plate and the lifter for elevating pin were the same as those used in Comparative Example 2. The liner 4 shown in FIGS. 3 and 4 was used. The area "SO" of the opposing face 4c of the liner was about 63,000 mm², and the area "SB" of the supported face 4g of the liner 4 was about 3000 mm². The thickness of the thin portion 4e of the liner 4 was 5 mm.

As a result, it was proved that the temperature difference on the wafer W was reduced to about 11° C. when the power supplied to the heater (susceptor) 5 was about 1500 W, which was lower than that required in Comparative Example 2.

As described above, the present invention provides a method of heating a semiconductor on a susceptor in a chamber, and a member therefore, wherein the temperature distribution on the susceptor can be reduced even when a target temperature of the susceptor is high. The present invention has been explained referring to the preferred embodiments, however, the present invention is not limited to the illustrated embodiments which are given by way of examples only, and may be carried out in various modes without departing from the scope of the invention.

The invention claimed is:

1. A member provided around a susceptor for mounting a semiconductor in a chamber of a semiconductor production system, said member comprising an inner face opposing an outer peripheral face of the susceptor and having a center line average surface roughness of 0.5 μm or less, wherein a space is provided between said outer peripheral face of said susceptor and said inner face of said member, and wherein said outer peripheral face of said susceptor and said inner face of said member face said space.

2. The member of claim 1, further comprising one of a gas supply plate and a liner.

3. The member of claim 1, further comprising a lifter for an elevating pin.

4. A semiconductor production system comprising a chamber, a susceptor for mounting a semiconductor, and the member of claim 1 provided around said susceptor.

5. A member provided around a susceptor for mounting a semiconductor in a chamber of a semiconductor production system, said member comprising a face opposing an outer peripheral face of the susceptor and having a thermal emissivity ε of 0.5 or less, wherein a space is provided between said outer peripheral face of said susceptor and said face of said member.

6. The member of claim 5, further comprising one of a gas supply plate and a liner.

7. The member of claim 5, further comprising a lifter for an elevating pin.

8. A semiconductor production system comprising a chamber, a susceptor for mounting a semiconductor, and the member of claim 5 provided around said susceptor.

9. A member provided around a susceptor for mounting a semiconductor in a chamber of a semiconductor production system, said member comprising a liner having a face opposing an outer peripheral face of the susceptor and a supported face whereby said liner is supported, said supported face having an area that is not more than 20 percent of an area of said face opposing the susceptor, wherein a space is provided between said outer peripheral face of said susceptor and said face of said liner opposing said outer peripheral face of said susceptor.

10. The member of claim 9, wherein a space is formed in said member.

11. The member of claim 10, wherein said space faces an inner wall surface of the chamber.

12. A semiconductor production system comprising a chamber, a susceptor for mounting a semiconductor, and the member of claim 9 provided around said susceptor.

13. A member provided around a susceptor for mounting a semiconductor in a chamber of a semiconductor production system, said member comprising a liner having an inner face opposing an outer peripheral face of the susceptor, a back face facing the chamber and a thin portion between said inner face opposing the susceptor and said back face, said thin portion having an average thickness that is not more than 10 mm, wherein a space is provided between said outer peripheral face of said susceptor and said inner face of said liner opposing said outer peripheral face of said susceptor, and wherein said outer peripheral face of said susceptor and said inner face of said liner face said space.

14. The member of claim 13, wherein a space is formed in said member.

15. The member of claim 14, wherein said space faces an inner wall surface of the chamber.

16. A semiconductor production system comprising a chamber, a susceptor for mounting a semiconductor, and the member of claim 13 provided around said susceptor.

* * * * *